United States Patent
Song et al.

(10) Patent No.: US 8,312,406 B2
(45) Date of Patent: Nov. 13, 2012

(54) METHOD AND SYSTEM PERFORMING RC EXTRACTION

(75) Inventors: Li J. Song, Fremont, CA (US); Taber Smith, Saratoga, CA (US); Hao JI, San Jose, CA (US); Zhan-Zhong Yao, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 161 days.

(21) Appl. No.: 12/489,340

(22) Filed: Jun. 22, 2009

(65) Prior Publication Data

US 2010/0325595 A1 Dec. 23, 2010

(51) Int. Cl.
G06F 17/50 (2006.01)

(52) U.S. Cl. ........ 716/122; 716/108; 716/110; 716/112; 716/113; 716/132

(58) Field of Classification Search ................... 716/109, 716/110, 103, 132, 108, 112, 122
See application file for complete search history.

(56) References Cited

U.S. PATENT DOCUMENTS

| | | | |
|---|---|---|---|
| 7,124,386 B2 | 10/2006 | Smith et al. | |
| 7,152,215 B2 | 12/2006 | Smith et al. | |
| 7,174,520 B2 | 2/2007 | White et al. | |
| 7,243,316 B2 | 7/2007 | White et al. | |
| 7,325,206 B2 * | 1/2008 | White et al. | 716/53 |
| 7,353,475 B2 | 4/2008 | White et al. | |
| 7,356,783 B2 | 4/2008 | Smith et al. | |
| 7,360,179 B2 | 4/2008 | Smith et al. | |
| 7,363,099 B2 | 4/2008 | Smith et al. | |
| 7,363,598 B2 | 4/2008 | Smith et al. | |
| 7,367,008 B2 | 4/2008 | White et al. | |
| 7,380,220 B2 | 5/2008 | Smith et al. | |
| 7,383,521 B2 | 6/2008 | Smith et al. | |
| 7,393,755 B2 | 7/2008 | Smith et al. | |
| 7,712,056 B2 | 5/2010 | White et al. | |
| 7,757,195 B2 | 7/2010 | Smith et al. | |
| 7,962,867 B2 | 6/2011 | White et al. | |
| 8,001,516 B2 | 8/2011 | Smith et al. | |
| 2005/0132306 A1 * | 6/2005 | Smith et al. | 716/1 |
| 2007/0266360 A1 * | 11/2007 | Cheng et al. | 716/11 |
| 2008/0216027 A1 * | 9/2008 | White et al. | 716/4 |
| 2009/0319976 A1 | 12/2009 | Liu et al. | |

OTHER PUBLICATIONS

Arora, N.D. et al., "Test chip for inductance characterization and modeling for sub-100nm X architecture and Manhattan chip design," Proceedings of the 2005 International Conference on Microelectronic Test Structures, 2005. ICMTS 2005. pp: 251-255.

(Continued)

*Primary Examiner* — Jack Chiang
*Assistant Examiner* — Brian Ngo
(74) *Attorney, Agent, or Firm* — Vista IP Law Group, LLP

(57) ABSTRACT

A method, system, and computer program product are disclosed for performing RC extraction. The present approach can consider multiple types of manufacturing processes, and allows location-based prediction data to be used in the context of net-based analysis. RC extraction can be more accurately performed based upon net-specific top and bottom adjustments to thickness prediction that are location-based. The net-based prediction data can be used for other purposes as well, such as to perform electrical hotspot analysis, to visually display physical properties of the nets, or allow queries for other data analysis purposes.

36 Claims, 6 Drawing Sheets

OTHER PUBLICATIONS

Dai, W. et al., "Timing analysis taking into account interconnect process variation," IEEE International Workshop on Statistical Methodology, 2001 6yh., pp. 51-53.

Rodriguez, N. et al., "Hotspot Prevention Using CMP Model in Design Implementation Flow," 9th International Symposium on Quality Electronic Design, 2008. ISQED 2008. pp. 365-368.

Liao, H. et al., "Integration of CMP Modeling in RC Extraction and Timing Flow," IEEE Custom Integrated Circuits Conference, 2007. CICC '07. pp. 249-252.

Liao, H. et al., "CMP Model Based RC Extraction," International Symposium on Integrated Circuits, 2007. ISIC '07. pp. 532-535.

Arora, N.D. et al., "Interconnect characterization of X architecture diagonal lines for VLSI design," IEEE Transactions on Semiconductor Manufacturing, May 2005, pp. 262-271.

Shah, S. et al., "On-Chip Inductance in X Architecture Enabled Design," ISQED '07. 8th International Symposium on Quality Electronic Design, 2007. pp. 452-457.

Arora, N.D. et al., "Atto-farad measurement and modeling of on-chip coupling capacitance," IEEE Electron Device Letters, Feb. 2004, pp. 92-94.

Arora, N.D. et al., "Modeling and Characterization of High Frequency Effects in ULSI Interconnects", Proc. NSTI Nanotech WCM 2006, pp. 46-51.

* cited by examiner

| CMP line width | Thickness Adjustment |
|---|---|
| $LW_1$ | $\Delta 1$ |
| $LW_2$ | $\Delta 2$ |
| $LW_3$ | $\Delta 3$ |
| $LW_4$ | $\Delta 4$ |
| $LW_5$ | $\Delta 5$ |
| ... | ... |

406 — CMP line width
408 — Thickness Adjustment

404 →

| Etch line width | Thickness Adjustment |
|---|---|
| $LW_1$ | $\Delta 1$ |
| $LW_2$ | $\Delta 2$ |
| $LW_3$ | $\Delta 3$ |
| $LW_4$ | $\Delta 4$ |
| $LW_5$ | $\Delta 5$ |
| ... | ... |

410 — Etch line width
412 — Thickness Adjustment

METHOD AND SYSTEM PERFORMING RC EXTRACTION

BACKGROUND AND SUMMARY

The invention is directed to an improved approach for designing, testing, and manufacturing integrated circuits.

A semiconductor integrated circuit (IC) has a large number of electronic components, such as transistors, logic gates, diodes, wires, etc., that are fabricated by forming layers of different materials and of different geometric shapes on various regions of a silicon wafer. To design an integrated circuit, a designer first creates high level behavior descriptions of the IC device using a high-level hardware design language. An electronic design automation (EDA) system or computer aided design (CAD) tools receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example. The circuit design is then transformed into a geometric description called a layout. The process of converting specifications of an integrated circuit into a layout is called the physical design. After the layout is complete, it is then checked to ensure that it meets the design requirements. The result is a set of design files, which are then converted into pattern generator files. The pattern generator files are used to produce patterns called masks by an optical or electron beam pattern generator. Subsequently, during fabrication of the IC, these masks are used to pattern chips on the silicon wafer using a sequence of photolithographic steps. Electronic components of the IC are therefore formed on the wafer in accordance with the patterns.

Rapid developments in the technology and equipment used to manufacture semiconductor ICs have allowed electronics manufacturers to create smaller and more densely packed chips in which the IC components, such as wires, are located very close together. When electrical components are spaced too close together, the electrical characteristics or operation of one component may affect the electrical characteristics or operation of its neighboring components.

Electrical analysis is typically performed to verify and check the electrical behavior and performance of the circuit design. For example, analysis is performed on the circuit design to obtain capacitance and resistance for specific geometric descriptions of conductors in the design, creating an estimation of the capacitance and resistance from a process which is called parasitic resistance and capacitance (RC) extraction. A RC analysis tool comprises software and/or hardware that translates a geometric description of conductor and insulator objects, or other shapes described in an IC design file or database, to associated parasitic capacitance values. The capacitance values may include total capacitance of a single conductor, defined as the source conductor, relative to neighboring conductors or separate coupling capacitance between the source and one or more neighboring conductors.

Many processing steps are employed when fabricating an integrated circuit. For example, chemical mechanical polishing (CMP) is a very important step that is used to form interconnects on the manufactured IC. In addition, etch processing is typically employed in which the lithographic patterns that define the dimensions of the circuitry are physically etched into the wafer surface or other thin films deposited on the wafer surface. Etch equipment includes mechanisms to selectively remove materials (e.g., oxide) from a wafer surface or thin films on the wafer surface patterned with lithography equipment. Metal deposition is a process step in a copper damascene flow that is used to deposit copper material within the interconnect structures.

However, significant variations may arise during the process of manufacturing the IC, such as variations in feature density, widths, and heights caused by lithography, etch, CMP, and/or deposition processes. For example, variations based upon CMP and etching processes are often caused by dielectric loss, dishing, erosion, or other metal losses.

These variations may cause significant differences between the intended dimensions of the circuit features and the as-manufactured dimensions of those features on a fabricated circuit product. The problem is that if the electrical analysis, such as RC extraction, is performed using the as-designed dimensions, then the analysis results will be incorrect if the as-manufactured dimensions are significantly different.

SUMMARY OF THE INVENTION

The present invention is directed to a method, system, and computer program product for performing RC extraction. According to some embodiments, the present approach can consider multiple types of manufacturing processes, and allows location-based prediction data to be used in the context of net-based analysis. RC extraction can be more accurately performed based upon net-specific top and bottom adjustments to thickness prediction that are location-based. The net-based prediction data can be used for other purposes as well, such as to visually display physical properties of the nets or queried for other data analysis purposes.

Other additional objects, features, and advantages of the invention are described in the detailed description, figures, and claims.

BRIEF DESCRIPTION OF FIGURES

FIG. 4 illustrates example look-up tables.

DETAILED DESCRIPTION

Embodiments of the present invention provide a method, system, and computer program product for using integrated modeling to generate net-based variation data that is used to perform electrical analysis. An exchange mechanism is described which facilitates the transfer of thickness variation data to an electrical analysis tool. For the purposes of illustration only, and not for purposes of limitation, the examples described below are illustrated with respect to RC extraction. However, that the present invention can be applied to any type of electrical analysis, such as RC parasitic extraction, timing extraction, IR drop analysis, electro-migration, crosstalk and noise analysis, and is not to be limited to RC extraction unless claimed as such.

By way of background, it is noted that pattern-dependent models can be used to predict variations of feature dimensions of an integrated circuit. Pattern-dependent models can also be used to predict topological variations of an integrated circuit. Further details regarding one approach for implementing and using pattern-dependent models is disclosed in US Patent Publication 2003/0229412, which is hereby incorporated by reference in its entirety.

At semiconductor manufacturing process node 65 nm and beyond, it becomes more and more useful for the designer to have access to accurate modeling of systematic variations, e.g., variations caused by manufacturing issues such as Chemical Mechanical Polishing (CMP), etch and lithography. These models are very useful at the design stage for achieving higher chip performance, yield, and time-to-volume.

Recently, modeling has been introduced to predict full chip wire thickness and chip surface topography variation (e.g. caused by the CMP and etch processes). Full-chip manufacturing process simulations for thickness variation are usually based on a fixed course-grained grid across the chip. The simulations are performed based on layout geometries, specifically averaged geometry information such as density and effective line width of a certain simulation window. Often the thickness information is not available on individual features, nor on nets or paths. However, parasitic extraction tools are net or path based. The resistance and capacitance values are associated with a certain net or path. The accurate simulations of the thickness variations on the net level and the information exchange between the manufacturing models and the parasitic extraction tools are required to achieve accurate RC and timing extractions.

Described here is a new invention that, in some embodiments, applies an exchange mechanism to pass thickness variation information obtained using a location based manufacturing models to RC extraction tools operating on the net level.

Figure 1:
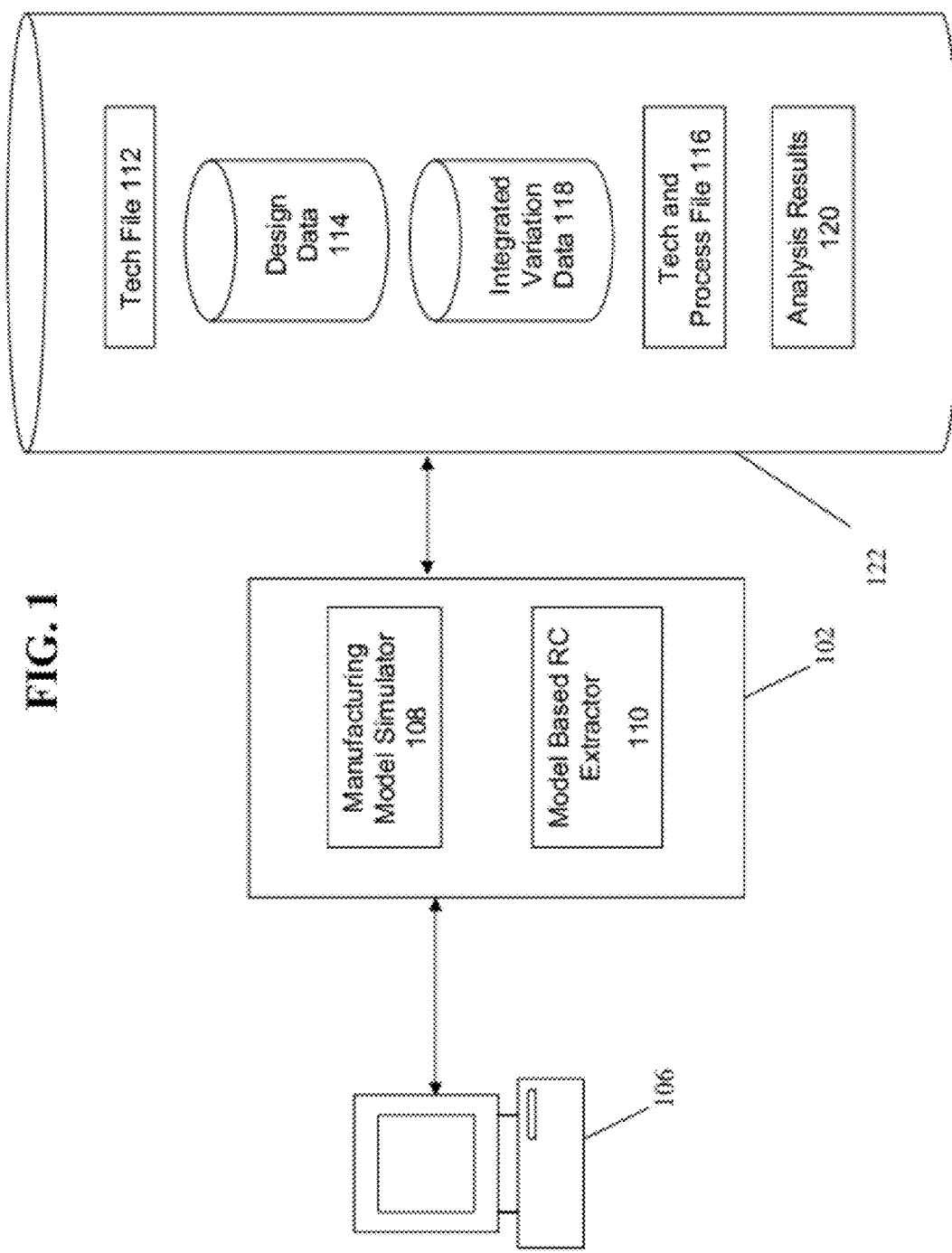
FIG. 1 illustrates a system for performing electrical analysis according to some embodiments of the invention.

FIG. 1 illustrates a system 100 for performing RC analysis according to some embodiments of the invention. System 100 includes one or more users at one or more user stations 106 for using and operating one or more EDA tools 102. EDA tool 102 comprises a modeling manufacture simulator 108 and a model-based RC extractor 110. The modeling manufacture simulator 108 operates to simulate the results of fabrication processing for a given electronic design. The model-based RC extractor 110 performs extraction based upon manufacturing models.

Data to be accessed or stored by the EDA tool 102 are stored in one or more data stores 122. A technology file 112 stores the modeling data used by the manufacturing model simulator 108 to perform simulation. For example, process models may exist within technology file 112 that are used to perform CMP and etch simulation. The design data 114 may also be stored in data store 122. The design data comprises the electronic design layout, e.g., in the GDS format.

The data stored in data store 122 may comprise databases having specific data structures for storage of items of data used by the EDA tool 102. The EDA tool 102 may operate to transform data that represents one type of state to another type of state. For example, electronic design data representative of physical features on an integrated circuit may be operated upon and transformed into electronic form suitable to be processed by a computer program, stored in a storage medium, or displayed on a display device.

The modeling manufacture simulator 108 uses the manufacturing models in technology file 112 to simulate manufacturing of the design or of individual blocks within the design.

The simulation results are typically location based, which refers to the average thickness/height within a certain tile/window (defined during simulation process) at a certain location.

The simulation results include thickness predictions modeled as topology variations. In the present embodiment, the thickness/height variation information is expressed at the resolution of a net or a feature level as adjustments from the average thickness/height based on manufacturing modeling results (e.g. ECD, CMP and etch). In other words, the location-based predictions are converted into net-based predictions that can then be used to perform RC extraction on a net-basis.

According to some embodiments, the process to perform a conversion from a location-based prediction to a net-based prediction is by making adjustments to the location-based predictions to account for characteristics of the specific nets. For example, consider typical location-based thickness predictions that operate to provide an average thickness for a grid, tile, or window within a layout. However, that grid, tile, or window may include geometries that are associated with multiple nets where there are differing characteristics for the objects associated with the different nets. Therefore, the average thickness/topology predictions may need to be adjusted to account for the specific properties of the objects associated with the individual nets. According to the present embodiment, any suitable parameter or combination of parameters may be considered when making the adjustment for the net-based prediction. For example, line-width of the net segments can be considered in making the topology adjustments form the location based predictions to the net-based predictions.

The location based average thickness/height and the adjustments based on net property (e.g. line width) are stored to an exchange file format that can be read by RC extraction tools, represented as the integrated variation data 118 in FIG. 1. The processes simulation results are stored in the exchange file so that RC extraction can be performed for an individual net with the accurate thickness and height information.

According to some embodiments of the invention, the integrated variation data file 118 comprises data for multiple manufacturing processes to accurately account for topological variations. In prior approaches, simulation results only provided topological variations based upon a single manufacturing process, e.g., CMP. The problem with considering only a single manufacturing process for simulation is that the simulation results do not accurately capture the effects upon the topography that are caused by a combination of the different manufacturing processes.

In the present embodiment, the simulation results are provided that consider the topological/thickness variations caused by both CMP and etch processes. This is because net-based thickness variations are due to feature (e.g. line width) dependency of the ECD, CMP and etch processes. Nets with different line width and density will have different degrees of dishing and erosion in the CMP process. The variation of copper (Cu) metal top surface (e.g. due to metal loss for a given net with a certain property) is added to the predicted tile based on the average metal thickness. Furthermore, the trench bottom height varies for the nets with different line widths and densities due to etch (e.g., Reactive Ion Etch (RIE) lag), macro and micro loading effect. The trench bottom, or metal bottom surface height variation, is included in addition to the predicted tile-based average trench bottom height.

According to some embodiments, the information in the exchange file format of the integrated variation data 118 comprises: 1) an average trench bottom height; 2) an average metal feature thickness; 3) multiple trench bottom height adjustments due to feature scale etch effects as a function of net geometry property (e.g. line width); and 4) multiple metal thickness adjustments due to feature scale CMP effect as a function of net geometry properties (e.g. line width). The aforementioned values are available for every metal level, and every location (tile or window) for a given design. The average trench bottom height is predicted using an etch model taking both long range (macro and micro loading) and short range (RIE or Reactive Ion Etch lag) effects into consideration, and a CMP model by taking the long range CMP effect and the multiple level topography propagation into consideration. The average Cu metal thickness for any net or path in the design can be queried. Together with feature scale CMP and etch adjustments at the top and the bottom metal surfaces, the thickness for the net can be calculated. The parasitic information for the net can therefore be extracted accurately using an RC extraction tool.

The information in the exchange file format of the integrated variation data 118 is used by an RC extractor 110 to perform extraction upon the electronic design. The RC extractor 110 accesses design data 114 from the data store to perform the extraction operations. According to the present embodiment, the RC extractor 110 is a model-based extractor that utilizes process models from a technology and process file 116 to perform the RC extraction operations.

The analysis results 120 from performing RC extraction are either displayed to a user on a display device at user station 106 or are stored into a storage device at data store 122.

The present approach provides numerous advantages over prior solutions, such as the prior approach of using location-based thickness file generated by a CMP manufacturing model to pass thickness variations to RC extraction tools. Since both etch and CMP affect Cu metal thickness, an accurate thickness prediction should include both CMP and etch manufacturing models as facilitated by the embodiments of the present invention. Furthermore, the manufacturing models should be able to simulate thickness variations as functions of individual net geometry property, such as line width. The function should be passed to RC extraction tools for accurate RC and timing extraction.

As noted above, the invention described here uses both CMP and etch manufacturing models, and applies an interface exchange file to let RC extraction tools to query feature scale CMP and etch simulation results for any individual net, allowing accurate RC and timing extractions.

The above-described embodiment implements the exchange mechanism in a file format, where the results of manufacturing models are exported into a file. The results include average interconnect thickness and height for the levels and locations predicted in the manufacturing models simulation windows, as well as thickness and height adjustment for an individual net or path based on models' dependencies on the net geometry property. The location or window based thickness and height are then read into an RC extraction tool. The thickness and height for a specific net is queried based on the net location and its geometry property. The nets that are located in multiple levels or across multiple model simulation windows are broken into segments and their RC values are extracted after the thickness and height adjustments are applied. The file format can include either text or binary data.

According to another embodiment, the exchange mechanism is implemented happening at a software API (application programming interface) level. In this alternate approach, the thickness and height information generated by manufacturing models can be stored in the computer memory and queried by RC extraction tools directly.

Figure 2:
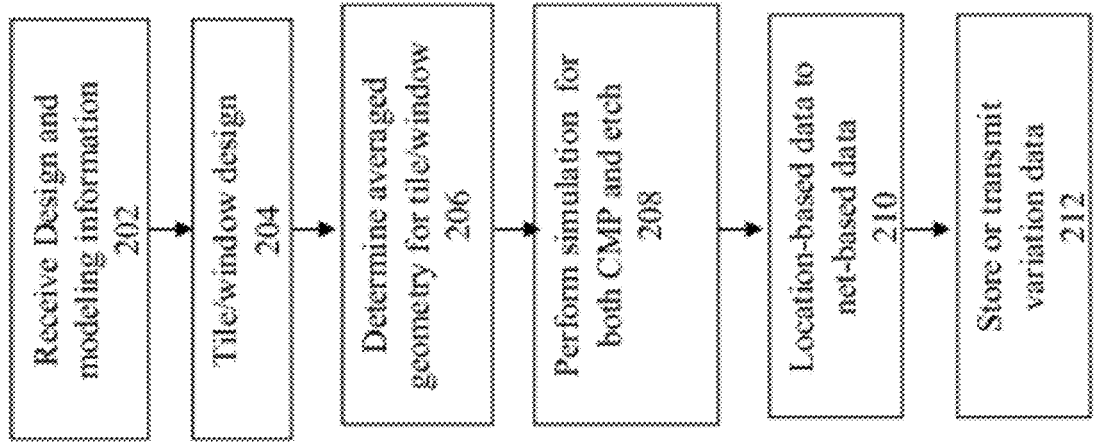
FIG. 2 illustrates a process for generating variation exchange data to be used for electrical analysis according to some embodiments of the invention.

FIG. 2 illustrates a process for generating and passing integrated variation information to perform RC extraction according to some embodiments of the invention. At 202, the electronic design and processing/manufacturing models are received by an EDA tool to perform simulation. The electronic design corresponds to the design information or layout of the design that is currently under examination, e.g., in the GDSII or GDSIII format. The models correspond to the types of manufacturing processes to be simulated. For example, a first set of models may be used to perform simulation based upon etching processes that are to be performed for the electronic design. A second set of models may relate to CMP processes that are to be performed to manufacture the design.

At 204, the design layout is portioned into a set of tiles or windows. Each tile/window corresponds to a bounded area of the layout having design elements to be manufactured, e.g., in 20 micron by 20 micron windows. Then, at 206, averaged geometries are determined for the windows/tiles. For example, these averaged geometries may include average density, perimeter, and effective line width values.

Thereafter, at 208, the EDA tool performs simulation of manufacturing processes to simulate the results of manufacturing the geometric shapes and patterns in each tile/window. In the present embodiment, multiple types of manufacturing processes are simulated to determine simulation results for manufacture of the electronic design. For example, simulation can be performed to determine the results of performing CMP and etch processes to manufacture the electronic design. Any suitable simulation or prediction tool may be employed to perform the process simulations. For example, a CMP prediction tool may be used to perform simulations for CMP processing.

The outputs from the simulations comprise location-based topological information for the design. For each of the processes that were simulated, thickness predictions are performed to identify the average thickness/height of the window or tile that has been examined. This provides variation data that identifies thickness variations that may occur as a result of the manufacturing processes.

Figure 3:
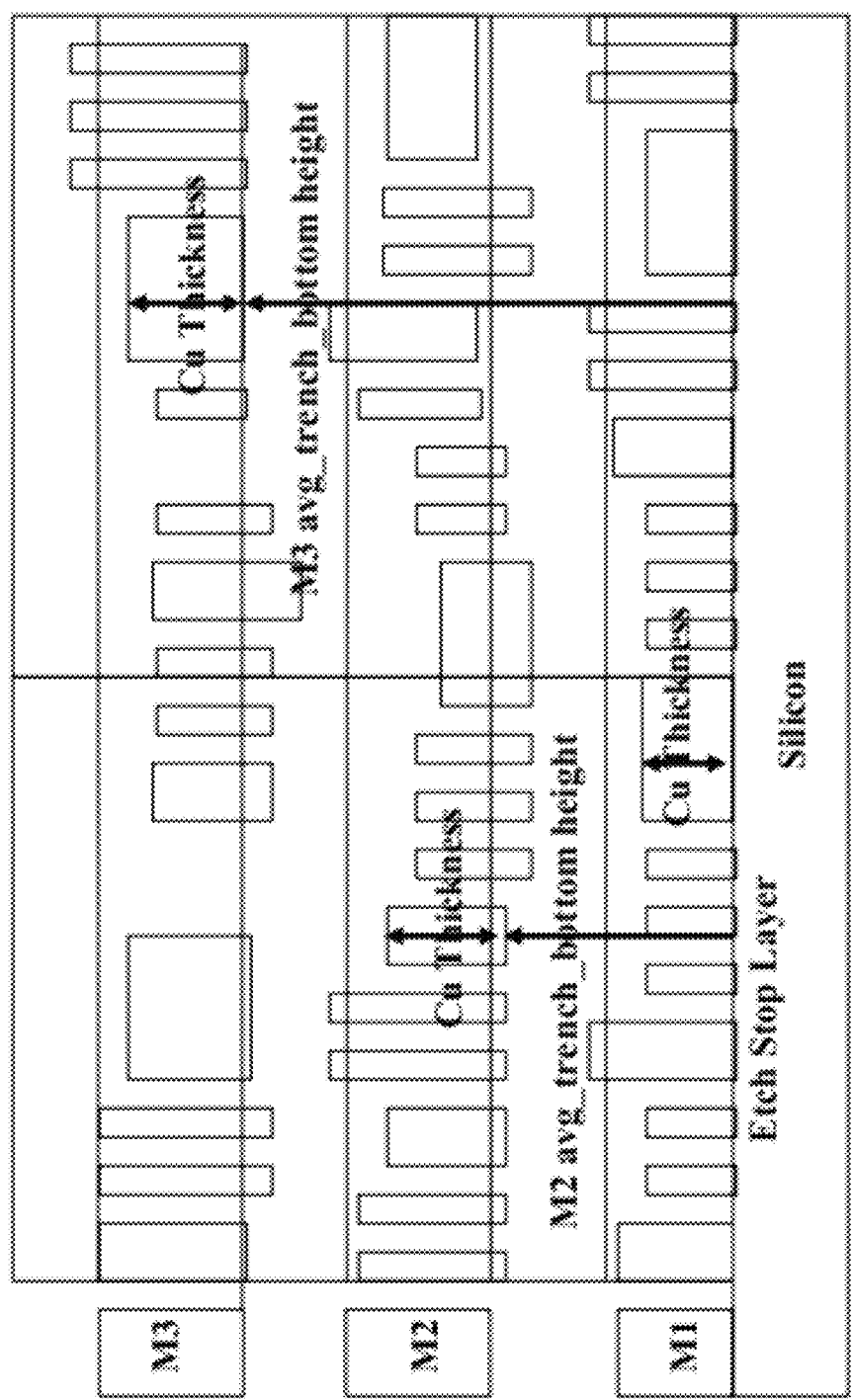
FIG. 3 depicts example heights/thicknesses of an IC product.

Integration of the prediction data is then provided based upon the multiple manufacturing processes, to identify the combined variations that would result from multiple manufacturing processes. To explain the benefit of this type of integration, consider the cross-sectional view of an IC product that is represented in FIG. 3. This figure illustrates multiple metal layers that are formed using a combination of CMP and etching processes. It can be seen that each metal layer corresponds to thickness variations that may occur from both the CMP and etching processes, in which the CMP processing causes variations to occur along the top surface of the layers, which the etching processing causes thickness variation to occur along the bottom heights of the layers. For example, the M2 average trench bottom height is affected by etch processing which causes variations to occur in the expected thickness of the M2 structures. The heights of the Cu thicknesses are affected by CMP processing that occurs for the M2 layer. Therefore, to obtain a true measure of the thickness variations for each layer, one would need to consider the effects of both types of processes, so as to account for the etch-related thickness variations as well as the CMP-related thickness variations. As such, considering the variations for each process separate from the other processes will not provide an accurate-enough estimate of the thickness variations that may occur during manufacturing. Since there are multiple layers in the IC product, there may be propagation of variations that occur from the bottom-most layers to the upper-most layers of the product.

According to some embodiments of the invention, the integrated variation data provided to the RC extraction tool comprises variation data for multiple manufacturing processes that are to be operated to manufacture the IC product. For example, the integrated variation data will provide thickness data based upon both CMP and etch manufacturing processes.

At this point, the thickness data corresponds to averaged data for the tiles and windows within the layout. In effect, the thickness/variation data is location-based data that relate to specific locations (i.e., windows/tiles) within the electronic design. To perform RC extraction, however, the location-based data should be converted to net-based data. While it is possible to use the averaged thickness variation data that corresponds to the locations in each window, this may cause inaccuracies to occur since the individual characteristics of each wire segment in the window may differ significantly from the averaged variation data values for the window as a whole.

In some embodiments, the exchange file generated by the present process comprises location-based manufacturing predictions of average interconnect thicknesses and net-based thickness adjustments. For example, the exchange file includes location-based manufacturing predictions of average interconnect trench bottom or surface height results and the net-based height adjustments, where the thickness adjustment includes etch adjustments on the trench bottom height, and the additional CMP adjustments on the top metal surface. The trench bottom or surface height adjustments are obtained by manufacturing modeling predictions based on the net or path geometry property. The exchange file is generated based on manufacturing modeling predictions to describe thickness and height accurately for an individual net or path, where the net or path geometry property that is considered includes the net or path line width.

Therefore, returning back to FIG. 2, the process provides information that allows the location-based data to be converted to net-based data at 210. The present embodiment converts the location-based prediction data into net-based prediction data by accounting for the specific characteristics and parameters of the net segments within the windows. According to one embodiment, the characteristics and parameters of the net segments are used to calculate differences between the average prediction values and the specific prediction values for each net segment. At 212, the information for the net-based variation data can then be stored or transmitted to be used by an RC extraction tool.

One approach that can be taken to convert location-based variation data to net-based variation data is to consider the thickness of each wire segment in the window, and then calculating specific thickness/height values for that wire segment based upon its line width. The starting point for the specific values is the averaged thickness/height values for the window/tile that contained the wire segment. Tables can be established that provide linewidth-specific thickness/height values based upon the averaged values.

FIG. 4 shows example look-up tables that can be used to perform this type of conversion from location-based variation data to net-based variation data. In particular, table 402 can be used to perform conversions based upon CMP processing and table 404 can be used to perform conversions based upon etch processing.

Table 402 shows a first column 406 with entries that correspond to different line-width values for the wire segments that may exist in a window. A second column 408 contains adjustments from the averaged thickness for each line-width entry in column 406. The adjustments can be represented as a thickness delta calculated from the averaged thickness for the window. To perform location-based to net-based conversion, the wire segments for a given net are identified in the window, and the line-width of those segments is also identified. For each of the identified wire segments, the predicted thickness of the wire segment can be determined by applying the corresponding delta to the averaged thickness for the window. At the end of this process, the predicted thickness of each wire segment (or each wire segment of interest) in the window is established and can then be used to perform RC extraction. The information from look-up table 402 for the CMP variations provide a top delta for the wire segment.

Similarly, table 404 shows a first column 410 with entries that correspond to different line-width values for the wire segments that may exist in a window and a second column 412 that contains adjustments from the averaged thickness for each line-width entry in column 410. With respect to etch processing, the adjustments are represented as a thickness delta calculated from the averaged thickness for the window. As previously described, to perform location-based to net-based conversion, the wire segments for a given net are identified in the window, and the line-width of those segments is also identified. Thereafter, for each of the identified wire segments, the predicted thickness of the wire segment can be determined by applying the corresponding delta to the averaged thickness for the window. At the end of this process, the predicted thickness of each wire segment in the window is established and can then be used to perform RC extraction. The information from look-up table 404 for the etch variations provide a bottom delta for the wire segment.

The present approach can be applied to any types of interconnect objects or structures in the IC. The interconnects may include metal lines, poly, or any other types of materials. In addition, the present approach can be used with any type of manufacturing processes, such as CMP, ECD, etch, or other processes used to form lines that connect circuits in the electronic design.

Figure 5:
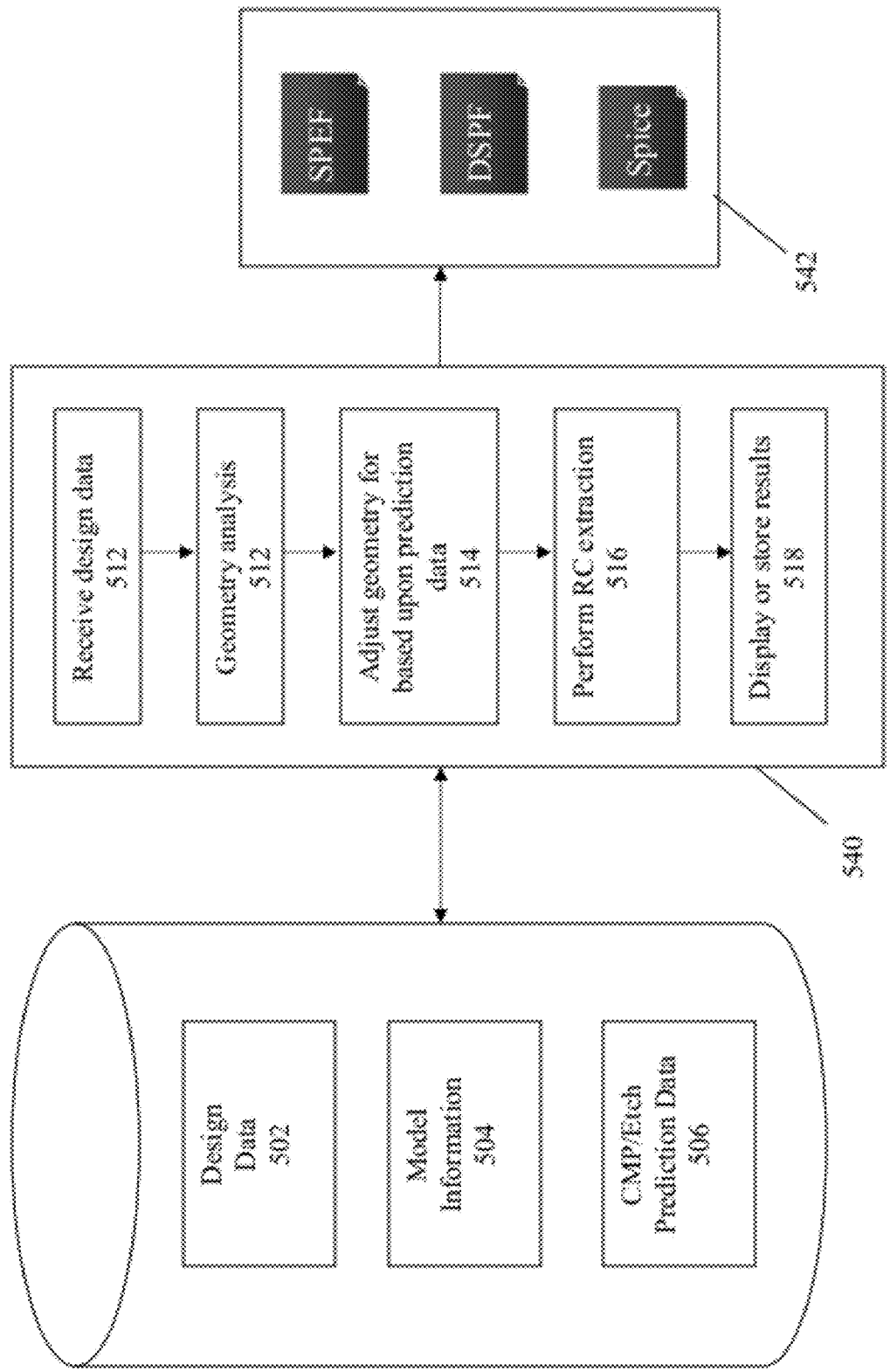
FIG. 5 illustrates an example system and process for performing RC extraction according to some embodiments of the invention.

FIG. 5 illustrates the process to perform model-based RC extraction based upon the exchange file information described above. The RC extraction tool 540 receives the electronic design data 502 at 510 and reviews the geometry information for that design at 512, e.g., by analyzing the (x,y) coordinate locations for wire segment objects in the layout.

Next, based upon the exchange file information 506, corrected thickness predictions are obtained for the wire segments. For example, the look-up tables 402 and 404 are used to identify top delta and bottom delta values that are then applied to the averaged thickness for the window corresponding to a given wire segment, to obtain the predicted thickness of that wire segment. The predictions are obtained for every wire segment for the nets that are going to be analyzed for the RC extraction. According to some embodiments, all nets undergo the above process to identify predicted thickness values for their corresponding wire segments. The thickness predictions can be organized for every net in the design, or for specific nets that are deemed to be of greater criticality or importance. For the nets, the predictions can be organized as well based upon their individual segments. In addition, since predictions can be based upon the segments, the predictions can exist for segments for the different layers.

At 516, RC extraction is performed for the nets in the electronic design. Any suitable tool can be employed to perform the RC extraction. In some embodiments, model-based RC extraction is performed using models 504. One example tool that can be used to perform model-based RC extraction is the QRC product, available from Cadence Design Systems, Inc. of San Jose, Calif. At 518, the results of performing RC extraction are stored in a storage medium 542 or displayed to the user on a display device. The analysis results can be stored in any suitable format or medium. For example, the analysis results can be stored in the SPEF, DSPF, or Spice formats.

The thickness prediction data for the nets can be used for many advantageous purposes. For example, the data can be used for electrical hotspot analysis. An example of an electrical hotspot analysis would be to calculate the resistance for the net and detect whether it falls outside of the tolerance for such a net. In addition, the data could be used to and facilitate hotspot fixing on specific net or path.

As another example, the predicted physical attributes of the nets can be visually displayed by displaying the thickness predictions for the different parts of the nets. In addition, the thickness prediction data can be queried and analyzed, even aside from its value for performing RC extraction.

Therefore, what has been described is a new approach for generating prediction data for electrical analysis. The present approach is more accurate since it can consider multiple types of manufacturing processes, and allows location-based prediction data to be used in the context of net-based analysis. For example, RC extraction can be more accurately performed based upon net-specific top and bottom adjustments to thickness prediction that are location-based. The net-based prediction data can be used for other purposes as well, e.g., to visually display physical properties of the nets or queried for other data analysis purposes.

System Architecture Overview

Figure 6:
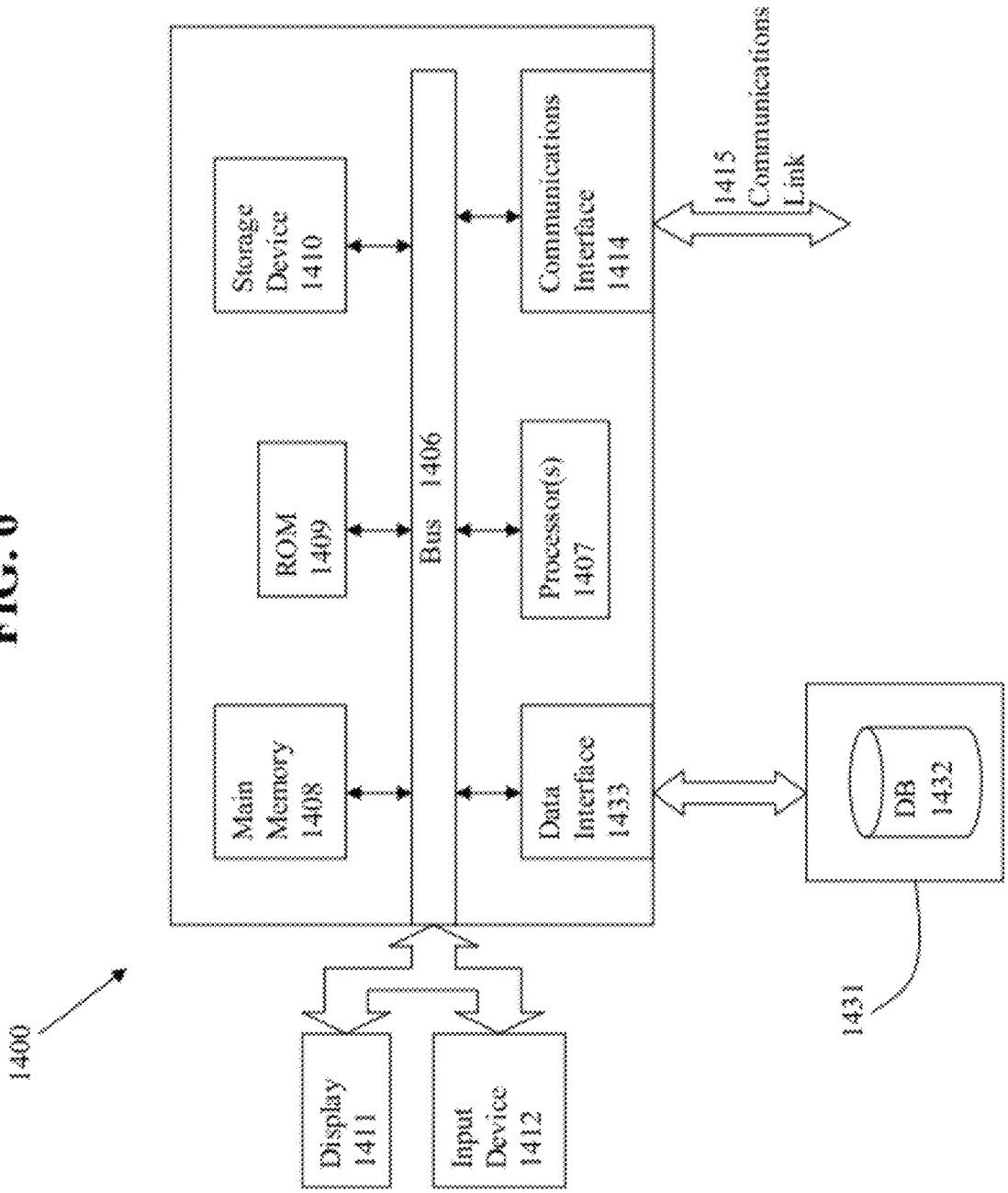
FIG. 6 shows an architecture of an example computing system with which the invention may be implemented.

FIG. 6 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer-implemented method for processing electronic design automation information about an electronic design, comprising:
  receiving design information about an electronic design;
  generating location-based variation data for the electronic design by analyzing the design information, wherein the location-based variation data corresponds to multiple manufacturing processes, wherein the location-based variation data is associated with a particular location of the electronic design and wherein the location-based variation data comprises average thickness/topology information for the particular location; and
  generating, by using a computer processor, conversion information to convert the location-based variation data to net-based variation data to be used by an electrical analysis tool to perform electrical analysis upon the electronic design, wherein the net-based variation data is associated with one or more nets of the particular location of the electronic design, wherein the location-based variation data and the conversion information are either displayed to a user on a display device or stored on a volatile or non-volatile storage medium in a data structure configured to store the location-based variation data or the conversion information and wherein the conversion information comprises net-based thickness/topology adjustments for the one or more nets of the particular location.

2. The method of claim 1 in which the location-based variation data and the conversion information are in an exchange file format or accessible through a software API.

3. The method of claim 2 in which the file format comprises text or binary format.

4. The method of claim 1 in which the location-based variation data comprises average interconnect thickness results.

5. The method of claim 4 in which the location-based variation data comprises average interconnect trench bottom or surface height results.

6. The method of claim 4 in which the net-based thickness adjustments comprises etch adjustments on the trench bottom height and CMP adjustments on the top metal surface.

7. The method of claim 6 in which the trench bottom or surface height adjustments are obtained by manufacturing modeling predictions based on the net or path geometry property.

8. The method of claim 1, in which the conversion information to convert the location-based variation data to the net-based variation data is based at least in part on net or path geometry property.

9. The method of claim 8 in which the net or path geometry comprises net or path line width.

10. The method of claim 1 in which thickness and height are predicted for an individual net or path.

11. The method of claim 10 in which the thickness or height is predicted for an interconnect structure that comprises poly or metal materials.

12. The method of claim 1, in which the multiple manufacturing processes comprises a combination of ECD, CMP, or etch.

13. The method of claim 1 in which the electrical analysis comprises RC parasitic extraction, timing extraction, IR drop, electro-migration, crosstalk, or noise analysis.

14. The method of claim 1 in which the location-based prediction data comprises data across multiple layers or levels and conversion corresponds to net-based thickness/topology adjustments across multiple layers or levels.

15. A computer-implemented method for performing electrical analysis upon an electronic design, comprising:
receiving design information about an electronic design;
receiving location-based variation data for the electronic design, wherein the location-based variation data corresponds to multiple manufacturing processes, wherein the location-based variation data is associated with a particular location of the electronic design and wherein the location-based variation data comprises average thickness/topology information for the particular location;
receiving information to convert the location-based variation data to net-based variation data, wherein the net-based variation data is associated with one or more nets of the particular location of the electronic design and wherein the information to convert the location-based variation data to net-based variation data comprises net-based thickness/topology adjustments for the one or more nets of the particular location;
using a computer processor to perform electrical analysis upon the electronic design based at least in part on the net-based variation data; and
displaying electrical analysis results to a user on a display device or storing the electrical analysis results on a volatile or non-volatile storage medium in a data structure configured to store the electrical analysis results.

16. The method of claim 15 in which the location-based variation data and conversion information used to convert the location-based variation data to the net-based variation data are stored in an exchange file format or accessible through a software API.

17. The method of claim 15 in which the location-based variation data comprises average interconnect thickness results.

18. The method of claim 17 in which the location-based variation data comprises average interconnect trench bottom or surface height results and the net-based thickness/topology adjustments comprises etch adjustments on the trench bottom height and CMP adjustments on the top metal surface.

19. The method of claim 15, in which information to convert the location-based variation data to the net-based variation data is based at least in part on net or path geometry property.

20. The method of claim 19 in which the net or path geometry comprises net or path line width.

21. The method of claim 15 in which thickness and height are predicted for an individual net or path to perform the electrical analysis.

22. The method of claim 15, in which the multiple manufacturing processes comprises a combination of ECD, CMP, or etch.

23. The method of claim 15 in which the electrical analysis comprises RC parasitic extraction, timing extraction, IR drop, electro-migration, crosstalk, or noise analysis.

24. The method of claim 15 in which the location-based variation data comprises data across multiple layers or levels and conversion corresponds to net-based thickness/topology adjustments across multiple layers or levels.

25. A system for processing electronic design automation information about an electronic design, comprising:
a memory that holds executable program code; and
a processor capable of executing the executable program code, wherein the executable program code comprises code for receiving design information about an electronic design, generating location-based variation data for the electronic design by analyzing the design information, wherein the location-based variation data corresponds to multiple manufacturing processes, wherein the location-based variation data is associated with a particular location of the electronic design and wherein the location-based variation data comprises average thickness/topology information for the particular location, and generating conversion information to convert the location-based variation data to net-based variation data to be used by an electrical analysis tool to perform electrical analysis upon the electronic design, wherein the net-based variation data is associated with one or more nets of the particular location of the electronic design, wherein the location-based variation data and the conversion information are either displayed to a user on a display device or stored on a volatile or non-volatile storage medium in a data structure configured to store the location-based variation data or the conversion information and wherein the conversion information comprises net-based thickness/topology adjustments for the one or more nets of the particular location.

26. A system for performing electrical analysis upon an electronic design, comprising:
a memory that holds executable program code; and
a processor capable of executing the executable program code, wherein the executable program code comprises code for receiving design information about an electronic design, receiving location-based variation data for the electronic design, wherein the location-based variation data corresponds to multiple manufacturing processes, wherein the location-based variation data is associated with a particular location of the electronic design and wherein the location-based variation data comprises average thickness/topology information for the particular location, receiving information to convert the location-based variation data to net-based variation data, wherein the net-based variation data is associated with one or more nets of the particular location of the electronic design, performing electrical analysis upon the electronic design based at least in part on the net-based variation data and wherein the information to convert the location-based variation data to net-based variation data comprises net-based thickness/topology adjustments for the one or more nets of the particular location, and displaying electrical analysis results to a user on a display device or storing the electrical analysis results on a volatile or non-volatile storage medium in a data structure configured to store the electrical analysis results.

27. A computer program product comprising a non-transitory computer readable medium, wherein the non-transitory computer readable medium comprises executable program code for implementing a method for processing electronic design automation information about an electronic design, the method comprising:
  receiving design information about an electronic design;
  generating location-based variation data for the electronic design by analyzing the design information, wherein the location-based variation data corresponds to multiple manufacturing processes, and wherein the location-based variation data is associated with a particular location of the electronic design and wherein the location-based variation data comprises average thickness/topology information for the particular location; and
  generating, by using a computer processor, conversion information to convert the location-based variation data to net-based variation data to be used by an electrical analysis tool to perform electrical analysis upon the electronic design, wherein the net-based variation data is associated with one or more nets of the particular location of the electronic design, and wherein the location-based variation data and the conversion information are either displayed to a user on a display device or stored on a volatile or non-volatile storage medium in a data structure configured to store the location-based variation data of the conversion information and wherein the conversion information comprises net-based thickness/topology adjustments for the one or more nets of the particular location.

28. A computer program product comprising a non-transitory computer readable medium, wherein the non-transitory computer readable medium comprises executable program code for implementing a method for performing electrical analysis upon an electronic design, the method comprising:
  receiving design information about an electronic design;
  receiving location-based variation data for the electronic design, wherein the location-based variation data corresponds to multiple manufacturing processes, wherein the location-based variation data is associated with a particular location of the electronic design and wherein the location-based variation data comprises average thickness/topology information for the particular location; and
  receiving information to convert the location-based variation data in a to net-based variation data, wherein the net-based variation data is associated with one or more nets of the particular location of the electronic design and wherein the information to convert the location-based variation data to net-based variation data comprises net-based thickness/topology adjustments for the one or more nets of the particular location;
  using a computer processor to perform electrical analysis upon the electronic design based at least in part on the net-based variation data; and
  displaying electrical analysis results to a user on a display device or storing the electrical analysis results on a volatile or non-volatile storage medium in a data structure configured to store the electrical analysis results.

29. The system of claim 25 in which the location-based variation data and the conversion information are in an exchange file format or accessible through a software API.

30. The system of claim 25, in which the conversion information to convert the location-based variation data to the net-based variation data is based at least in part on net or path geometry property.

31. The system of claim 26 in which the location-based variation data and the conversion information are in an exchange file format or accessible through a software API.

32. The system of claim 26, in which information to convert the location-based variation data to the net-based variation data is based at least in part on net or path geometry property.

33. The computer program product of claim 27 in which the location-based variation data and the conversion information are in an exchange file format or accessible through a software API.

34. The computer program product of claim 27, in which the conversion information to convert the location-based variation data to the net-based variation data is based at least in part on net or path geometry property.

35. The computer program product of claim 28 in which the location-based variation data and the conversion information are in an exchange file format or accessible through a software API.

36. The computer program product of claim 28, in which information to convert the location-based variation data to the net-based variation data is based at least in part on net or path geometry property.

* * * * *